(12) United States Patent
Luo (10) Patent No.: US 8,471,614 B2
(45) Date of Patent: Jun. 25, 2013

(54) DIGITAL PHASE LOCKED LOOP SYSTEM AND METHOD

(75) Inventor: Zhihong Luo, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 85 days.

(21) Appl. No.: 13/160,072

(22) Filed: Jun. 14, 2011

(65) Prior Publication Data

US 2012/0319748 A1 Dec. 20, 2012

(51) Int. Cl.
*H03L 7/06* (2006.01)

(52) U.S. Cl.
USPC ........................................... 327/158; 327/149

(58) Field of Classification Search
USPC .................................. 327/149, 158
See application file for complete search history.

(56) References Cited

U.S. PATENT DOCUMENTS

| | | | | |
|---|---|---|---|---|
| 6,594,330 B1 * | 7/2003 | Wilson | ........................... | 375/376 |
| 7,577,225 B2 * | 8/2009 | Azadet et al. | ................. | 375/373 |
| 7,859,344 B2 * | 12/2010 | Uozumi et al. | ............... | 331/1 A |
| 8,299,828 B2 * | 10/2012 | Endo et al. | ..................... | 327/156 |
| 2008/0136532 A1 * | 6/2008 | Hufford et al. | ................. | 331/10 |
| 2009/0147902 A1 | 6/2009 | Liu et al. | | |
| 2010/0085220 A1 | 4/2010 | Zhang | | |
| 2011/0032013 A1 * | 2/2011 | Nelson et al. | .................. | 327/156 |
| 2011/0140747 A1 * | 6/2011 | Endo et al. | ..................... | 327/156 |
| 2011/0187423 A1 * | 8/2011 | Eckhardt et al. | ................ | 327/156 |
| 2012/0032715 A1 * | 2/2012 | Subburaj et al. | ............... | 327/115 |
| 2012/0194235 A1 * | 8/2012 | Subburaj et al. | ............... | 327/156 |
| 2012/0212266 A1 * | 8/2012 | Endo et al. | ..................... | 327/156 |

OTHER PUBLICATIONS

Office Action for German Application No. 10 2011 088 719.9, dated Aug. 20, 2012, pp. 1-5.

* cited by examiner

*Primary Examiner* — Adam Houston
(74) *Attorney, Agent, or Firm* — Ditthavong Mori & Steiner P.C.

(57) ABSTRACT

A phase locked loop control system includes a digital controlled oscillator (DCO) that is controlled by logic cells in response to comparison of the oscillator output with a reference clock related signal. Delay cell number adjustment, delay cell load adjustment and cycle control are operative to digitally control the DCO frequency to obtain wide frequency range and limited jitter.

12 Claims, 9 Drawing Sheets

OUTPUT CLOCK IS
RESET TO A KNOWN
STATE

DIGITAL PHASE LOCKED LOOP SYSTEM AND METHOD

BACKGROUND

This disclosure is related to controlling an output signal with frequency and phase precisely related to the frequency and phase of an input "reference" signal, more particularly to phase locked loop (PLL) control.

PLL control circuits are widely used in radio, telecommunications, computers and other electronic applications. They may generate stable frequencies, recover a signal from a noisy communication channel, or distribute clock timing pulses in digital logic designs such as microprocessors. Traditionally, the PLL circuit has been an analog block, including the basic components of a voltage control oscillator (VCO), phase and frequency detector (PFD), charge pump, low pass filter (LPF) and a feedback path. However, such analog PLL circuits comprise a plurality of capacitors which require a significantly large chip area. Additionally these circuits are very sensitive to power noise.

More recently, PLL circuit design has evolved to a greater use of digital control. The first generation digital PLL uses one external high frequency clock to sample the reference clock, then generate the output clock by dividing or multiplying a certain number according to requirement. The frequency of an external clock having accuracy required by such PLL circuit is limited with respect to its capability for applying a sampling rate that can accommodate high frequency reference clock signals. As this design can only be used in low frequency applications, a hybridization of analog and digital elements has been pursued. With such approach, chip area has not been significantly reduced, while performance is markedly decreased.

A need thus exists for a digital PLL circuit that is not limited to the existing PLL structures. Performance capabilities, such as high DCO frequency range, long term jitter control, low power consumption, low lock time, are highly desirable. Such digital PLL circuit should encompass a small chip area and exemplify good performance.

SUMMARY OF DISCLOSURE

The needs described above are fulfilled, at least in part, by use of a phase locked loop control system comprising a digital controlled ring oscillator that is controlled in response to comparison of the oscillator output with a reference clock related signal, by use of a digital phase and frequency detector. The ring oscillator frequency may be adjusted through a combination of varying the number delay cells coupled to the loop and the amount of loading on the cells. Phase adjustment can be obtained by selectively controlling the oscillator load during each clock cycle, thereby providing great precision in tuning the oscillator output frequency. In one embodiment, the basic ring oscillator circuit is made up of NAND gates thereby making it possible for the oscillator output to be reset in a short time and hence mitigate the effects of any drifts in the output clock.

BRIEF DESCRIPTION OF DRAWINGS

Various exemplary embodiments are illustrated by way of example, and not by way of limitation, in the figures of the accompanying drawings in which like reference numerals refer to similar elements and in which.

DETAILED DISCLOSURE

A digital controlled oscillator is controlled in response to comparison of the oscillator output with a reference clock related signal, by use of a digital phase and frequency detector. The cycling rate of the oscillator output is counted, the count is reset after a predetermined number of cycles, and the reset frequency is compared with the reference clock related signal.

An input divider can be coupled to the reference clock input for dividing the reference clock signal to one of a plurality of preset dividing rates. An output divider can be coupled to the oscillator output for dividing the oscillator output signal to one of a plurality of preset dividing rates. Each of the dividers may have a control input for selecting a respected dividing rate.

The digital controlled oscillator comprises a plurality of decoder logic cells. A first group of the decoder cells provide a relatively large signal delay; a second group of decoder cells provide a relatively smaller delay. The basic delay cell of this ring oscillator comprise NAND gates, which can totally reset DCO in a very short pulse. Logic load elements, having control inputs, are included in the oscillator for fine adjustment of the oscillator output.

The digital detector comprises a control signal generator that can generate a plurality of binary control signals respectively output to the plurality of decoder logic cells of the oscillator. The control signal generator is responsive to the divided reference clock signal. A first comparator input is coupled to the input divider, a second comparator input is coupled to the counter, and the output of the comparator is coupled to the control signal generator. A first input of a shift generator is coupled to the input divider and a second input of the shift generator is coupled to the comparator output. The shift generator applies additional control signals to the oscillator. The shift generator may comprise a plurality of flip-flops connected in series, each flip-flop having an output coupled to a respective control input of the oscillator.

The digital phase and frequency detector further comprises an asynchronous cycle control generator having one input coupled to the oscillator output and another input coupled to the divided reference clock signal. The control signal generator binary output control signals are fixed to capture the frequency of the reference clock signal and the asynchronous cycle control generator is responsive to the phase of the oscillator output signal relative to the divided reference signal.

Initially, a binary search can be performed during comparison of the divided reference clock signal and oscillator feedback to determine the states of the various binary control signals for the decoder logic cells and logic load elements. These binary control signals adjust the frequency and phase of the oscillator output. Cycles of the oscillator output signal are counted, cycle count reset after a predetermined number of cycles. Comparison of the oscillator output with the divided reference clock signal is made at each reset count. A lock detector is responsive to the dividing rates of the input divider and output divider to generate a lock output signal. If a change in the dividing rates of either the input divider or output divider has been detected, an unlock generator will output a reset signal to reinitiate the binary search.

Figure 1:
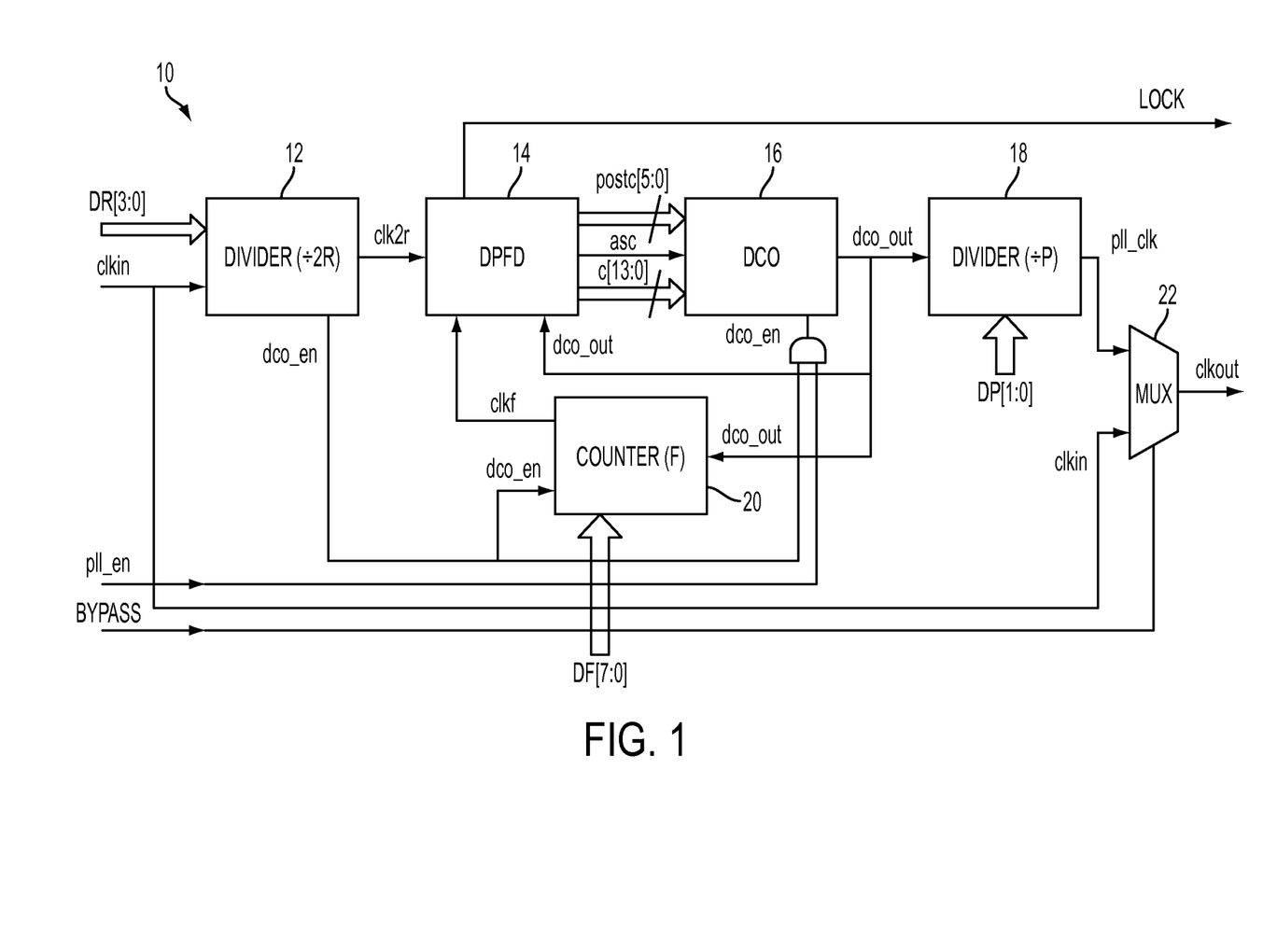
FIG. 1 is a block diagram of a PLL system in accordance with one embodiment of the present disclosure.

The PLL system, shown in block diagram in FIG. 1, receives a reference clock input signal "clkin" and produces an output signal "clkout." The PLL circuit comprises modules which are purely composed of logic components, with no capacitors, resistors, or other analog components. Divider 12 receives input clock signal "clkin" and divides its frequency by 2DR to produce an output clock signal "clk2r" having a duty cycle of 50%. In FIG. 1, the value of DR may vary between 1 to 15, as set by input DR. Output clock signal "clk2r" is coupled to an input of digital phase and frequency detector (DPFD) 14. DPFD 14 produces binary control signals that are received by digital controlled oscillator (DCO) 16. An optional output clock divider 18 can be used to receive DCO output signal "dco_out" and generate an output clock signal with a lower frequency. The output divider value can be set, for example, at 1, 2, 4, 8, by input DP. An input of counter 20 is coupled to the output of DCO 16. Output "clkf" of counter 20 is applied to DPFD 14. DCO output signal "dco_out" is also coupled to another input of DPFD 14. Divider 12 also generates an output enable DCO output signal "dco_out" signal "Dco_en" that is used to reset the DCO and counter(F) at the beginning of each clk2r cycle.

During operation, DPFD 14 will detect whether the DCO output clock frequency dco_out is higher or lower than expected by comparing the clk2r signal with a clkf output signal from counter 20. If the DCO output clock signal dco_out is not within an acceptable range, the DPFD 14 generates digital control signals c, asc and postc which are used to increase or decrease the DCO output clock frequency. Control signals c, asc and postc are in the form of binary numbers. In the exemplary embodiment of FIG. 1, c consists of 14 binary characters c[0] to c[13], asc consist of a single binary character while post c has six characters postc[0] to postc[5]. DCO: Digital Control Oscillator. A ring oscillator, by digitally changing the delay of the ring oscillator loop based on the values of c, asc and postc, the DCO output clock frequency can be adjusted.

When input signal "pll_en" turns high, the PLL system in FIG. 1 will start to oscillate. Divider 12 divides input clock signal clkin by 2DR to produce an output clock signal clk2r with a 50% duty cycle clock. Clock signal clk2r is fed to the DPFD 14. The dco_en signal generated by divider 12 is a very small pulse (for example, around 200 ps) that occurs just before the rising edge of clk2r. The dco_en signal is used to reset DCO 16 and Counter 20 at the beginning of every clk2r cycle.

Figure 6:
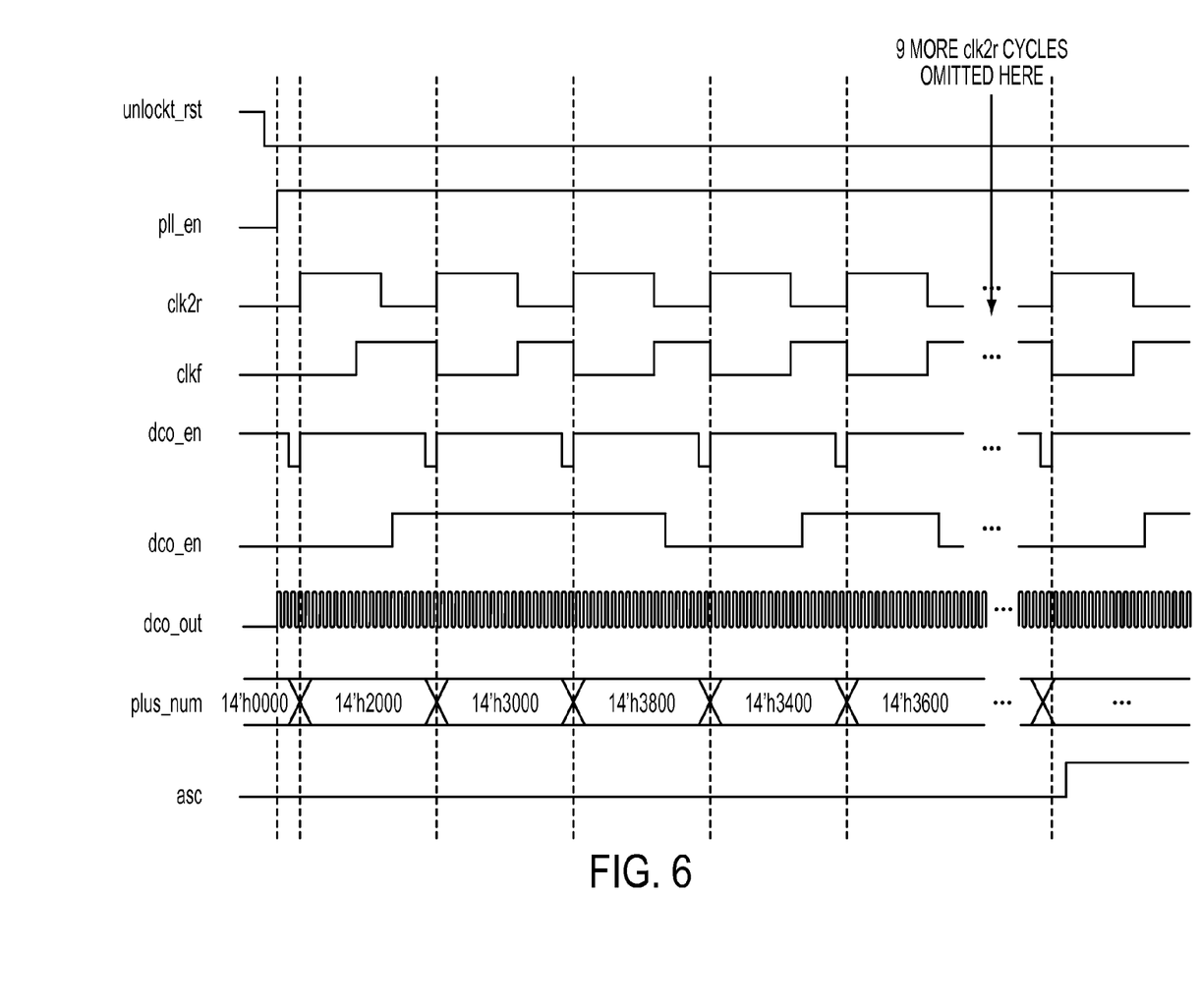
FIG. 6 is a waveform diagram exemplifying PLL operation.

The DCO output dco_out is a high frequency signal that is used as the clock of counter 20. Counter 20 will start to count from 0 at the beginning of every clk2r cycle. When the count arrives at DF[7:0], the counter's output clkf will turn high. DF[7:0] is an 8 character user defined binary number. As shown in FIG. 6, output signal dco_en from divider 12 resets clkf to low at the rising edge of a clk2r clock cycle.

At each falling edge of "clk2r", DPFD 14 will detect whether clkf is high or low. If clkf is high, this means that the DCO output clock frequency is higher than expected. If clkf is low, this means that the DCO output clock frequency is lower than expected. If the DCO output clock frequency is higher or lower than expected, DPFD 14 will adjust the digital control bits c[13:0], asc, postc[5:0] accordingly, which will make the DCO output frequency change until, in a certain clk2r cycle, the clk2r falling edge and the clkf rising edge are perfectly matched. In that condition, the DCO output clock dco_out frequency will be equal to DF/DR times the frequency of clkin. The frequency of the output divider 18 clock "pll_clk" will be equal to $(DF/DR)/2^{DP}$ times of the frequency of "clkin". The PLL output "clkout" is generated by multiplexer 22, A "bypass" signal is used to control multiplexer 22 to select whether the its pll_clk input or its clkin input is provided as the PLL output clkout signal.

Figure 2:
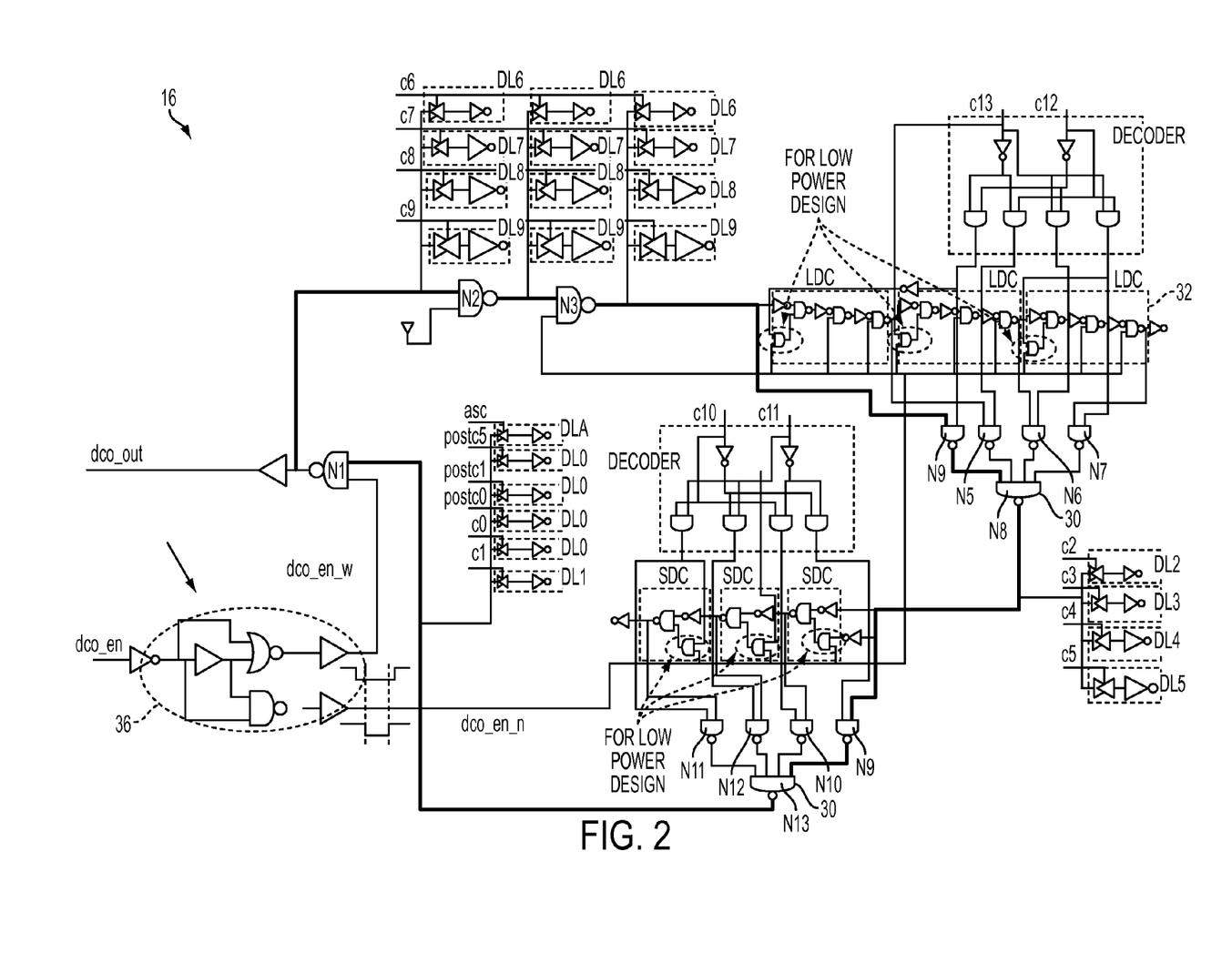
FIG. 2 is a schematic representation of an exemplary digital controlled oscillator for the PLL system of FIG. 1.

FIG. 2 is a detailed schematic of a DCO 16 which may be used in the PLL circuit of FIG. 1. DCO 16 is a ring oscillator used to generate the frequency adjustable output clock. Although this DCO is completely composed of logic cells, it is designed to tune some of the transistor parameters. In general, the frequency of the DCO may be tuned by selecting the number of delay cells to be included in the ring oscillator and varying the amount of delay cell load. Such design makes it possible to obtain wider frequency range and better resolution. The values of C[13:10] from the c control signal are used to change the number of delay cells included in the ring oscillator, while the values of C[9:0] from the c control signal are used to change the delay cell's load.

Figure 3A:
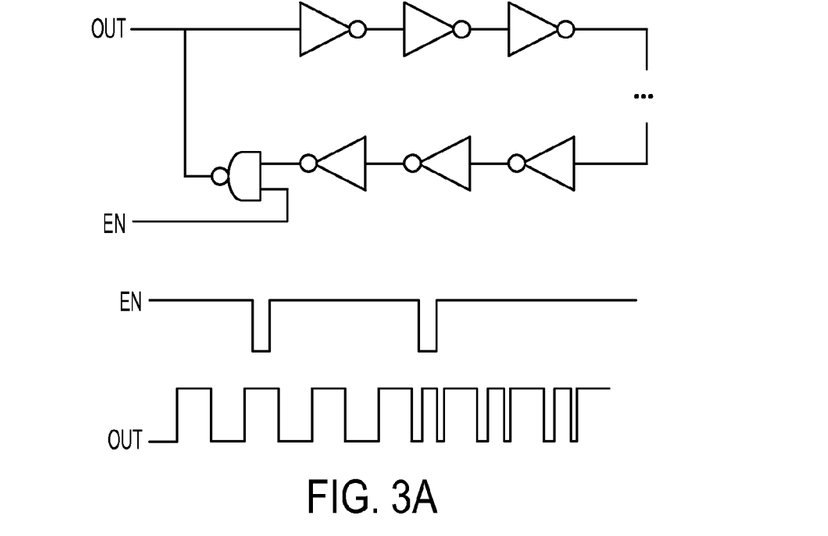
FIGS. 3A and 3B are logic cell diagrams of an exemplary inverter ring oscillator architecture and an exemplary NAND ring oscillator architecture, respectively.
Figure 3B:
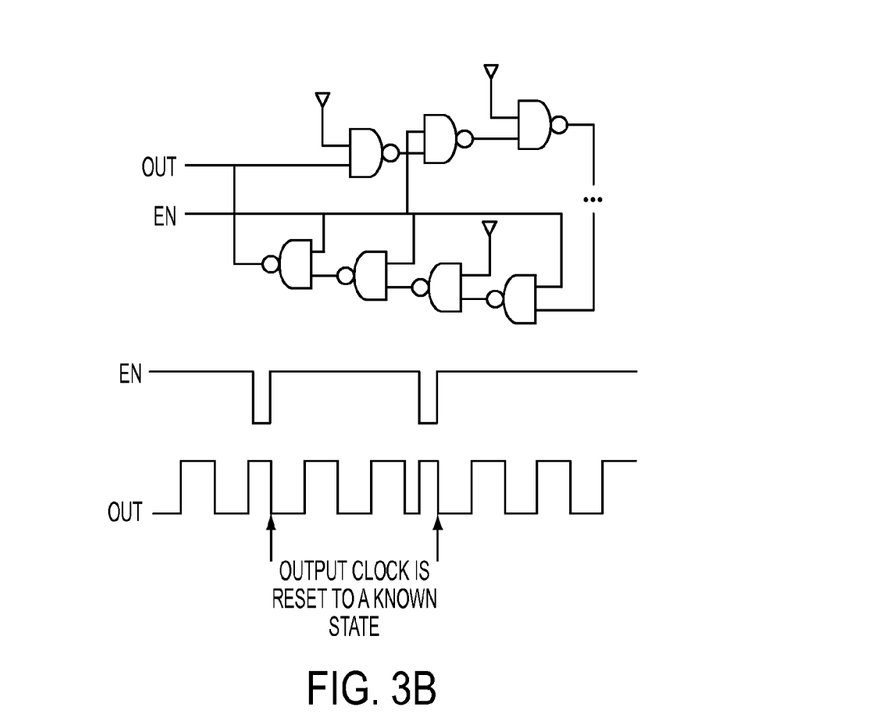

NAND gates 30 (only some of which are represented by reference numerals in the drawings) are used as the basic delay cells for the ring oscillator. In FIG. 2, an odd number of NAND basic delay cells are used to form the basic ring oscillator configuration. Specifically, when c[13:10] are all 0, N1, N2, N3, N4, N8, N9, N13 make up the ring oscillator (see the thick line in FIG. 2). An advantage of using NAND gate basic delay cells is that it enables the DCO to be disabled and reset within a very short time. This prevents any jitter from accumulating to the next clk2r cycle, thus substantially reducing long term jitter. For example, a very short negative pulse (around 200 ps) at the beginning of clk2r cycle on "dco_en" can completely reset the DCO to a known state (W1=1, W2=0, W3=1, W4=0, W8=1, W9=0, W13=1) so that any jitter will not accumulate to the next clk2r cycle. On the other hand, if inverters were to be used as the basic delay cell, the "EN" pulse width must larger than the whole loop delay, otherwise the ring oscillator cannot start from a known state after "EN" pulse, as illustrated in FIGS. 3A and 3B. FIGS. 3A and 3B are logic cell diagrams for inverter ring oscillator architecture and NAND ring oscillator architecture, respectively.

There are 3 LDCs (Large Delay Cells) 32 in DCO that can be selected to be included in the ring. Control signals c[13:12] control how many LDCs are included in the ring. Depending on the c[13:12] combination (2'b00: 0, 2'b01:1, 2'b10:2, 2'b11:3), one or more of the LDCs may be included in the ring or all three LDCs may be excluded. The DCO also includes 3 SDCs (Small Delay Cells) 34 that can be selected to be included in the ring. Control signals c[11:10] control how many SDCs are included in the ring. Depending on the c[11:10] combination (2'b00: 0, 2'b01:1, 2'b10:2, 2'b11:3), one or more of the SDCs may be included in the ring or all three SDCs may be excluded. With different numbers of LDCs and SDCs in the ring, the period of the ring oscillator output clock will be changed accordingly.

The DCO in FIG. 2 also includes load cells that are used to vary the amount of load on NAND gates N1, N2, N3, N8 and N13. On the output of NAND gate N1, N2, N3, there are load cells (DL9, DL8, DL7, DL6) connected in accordance with control signals c[9:6]. For each load cell, the control signal switch on or switch off will change the load of N1, N2, N3 to a certain value, which will also make the period of the ring oscillator output clock change accordingly. On the output of NAND gate N8, there are load cells (DL5, DL4, DL3, DL2) connected in accordance with control signals c[5:2]. Switching on or off c[5:2] separately will change the load of N8 so as to change period of the ring oscillator output clock. On the output of NAND4, gate N13, there are also load cells (DL1, DL0, DLA) connected in accordance with control signals c[1:0], postc[5:0], asc. Switching on or off c[1:0], postc[5:0], asc, will change the load of N13 so as to change period of the ring oscillator output clock.

From c[13] to c[0], the weight on the DCO output clock period change becomes smaller and smaller. To meet the requirement of a binary search, the weight for c[13:0] is carefully tuned. Controls "postc[5:0]" and "asc" are also delay cell load control pins. Control asc is used for cycle control, and postc[5:0] is used for input clock jitter tolerance after the PLL is locked.

The 6 AND cells of the LDC and SDC decoders circled in FIG. 2 are used to switch off unused cells so as to avoid unnecessary power consumption when DCO is oscillating. These cells server to remove glitch and assure that the whole loop is not blocked upon start DCO oscillation. Two signals "dco_en_w" and "dco_en_n" will be generated by the AND cells 36 from dco_en. Signal dco_en_w as a pulse turns low ahead of dco_en_n and turns high behind dco_en_n. Signal dco_en_w is connected to NAND gate N1, while signal dco_en_n is connected to other NAND gates in the loop. Thus it output clock glitch can be removed to make sure when DCO starts to oscillate that the whole loop is not blocked.

Figure 4:
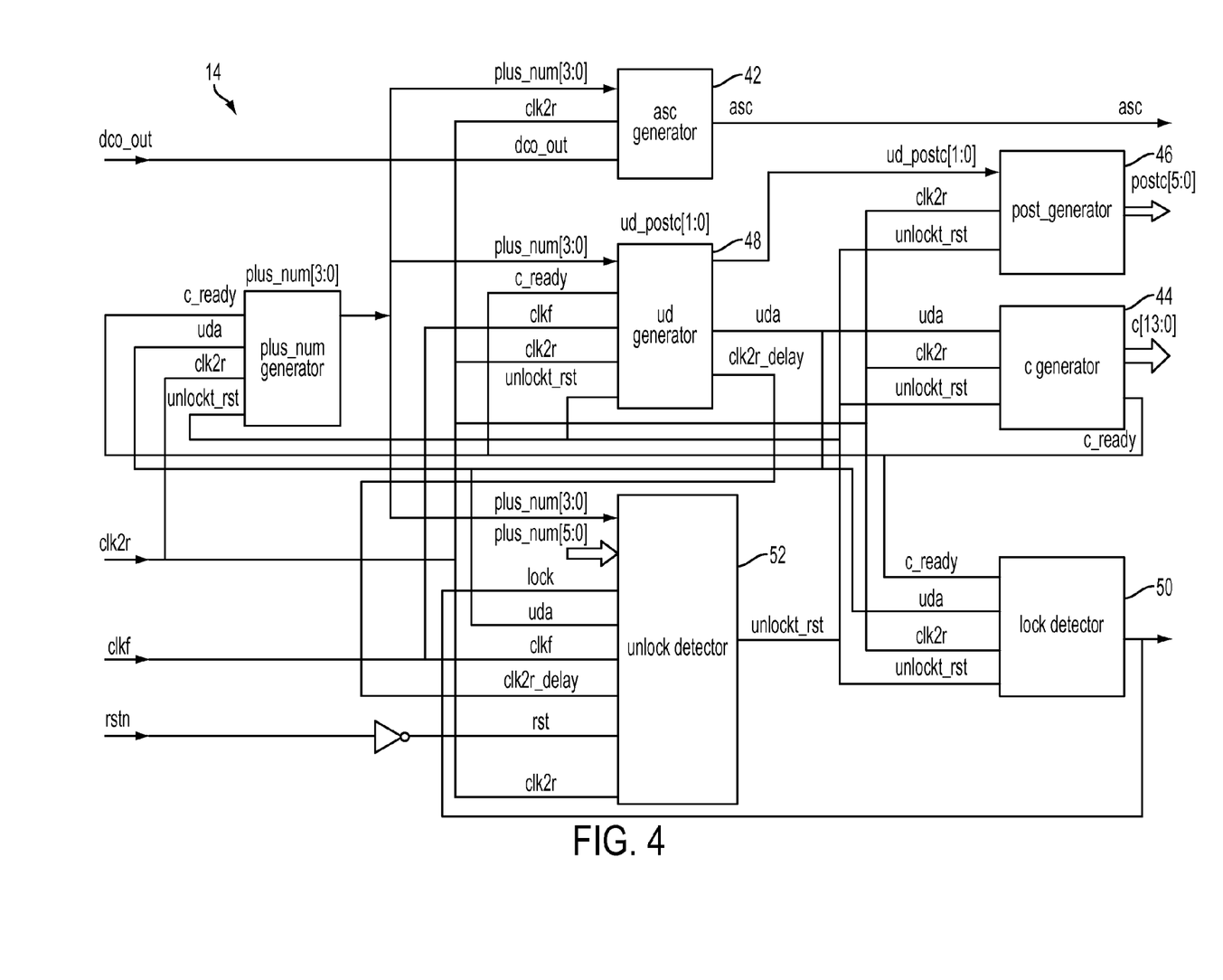
FIG. 4 is a block diagram of a digital phase and frequency detector represented in FIG. 1.

FIG. 4 is a detailed schematic of a DPFD which may be used in the PLL circuit of FIG. 1. The DPFD receives input signals dco_out from the DCO, clk2r from divider 12R, clkf from counter 20, and rstn. These signals are coupled to, or interact with, the following circuit modules in DPFD 14.

A plus_num generator 40 generates the signal plus_num [3:0] which helps to determine for every twelve dco_out cycles how many dco_out cycles asc is to be set at a 1'logic state. An asc generator 42 generates output signal "asc" for DCO 16. A c generator 44 generates output signal c[13:0] for DCO 16. A postc generator 46 generates output signal postc [5:0] for DCO 16. A ud generator 48 generates the signals uda and ud_postc, which are indicative of whether the DCO 16 is to oscillate faster or slower. A lock detector 50 detects whether the PLL is locked. An unlock detector 52 detect whether or not the PLL lock is lost.

The ud generator 48 module checks if clkf is high or low at each falling edge of the clk2r signal. If clkf is high, output signal uda from the ud generator 48 will be a logic '1' state, otherwise uda will be a logic '0' state. The uda signal is fed to the c generator 44, which generates values for the c[13:0] binary output string based on the uda value at each clk2r cycle after pll_en is enabled (switched to high).

Figure 5:
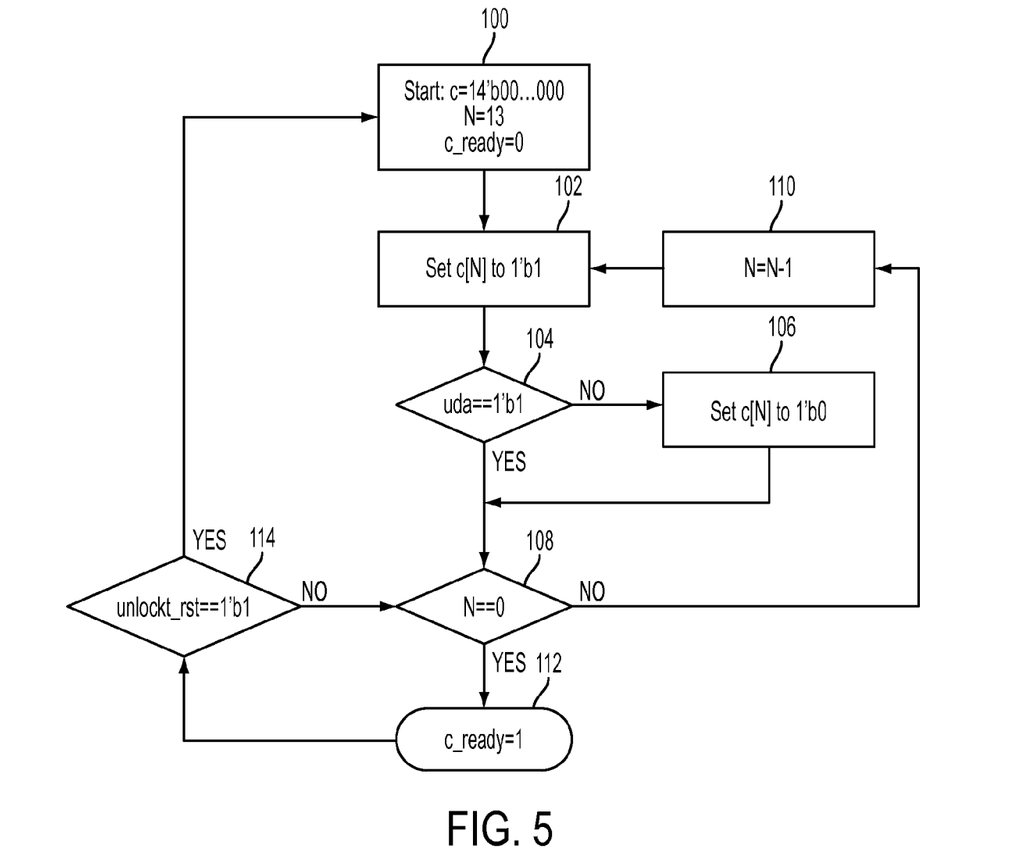
FIG. 5 is a logic data flow chart for setting control signals represented in FIGS. 1 and 2.

Operation is explained more particularly with respect to the data flow chart of FIG. 5 and the waveforms shown in FIG. 6. The c generator 44 uses a binary search to determine the values for c[13:0] and to achieve a fast lock. When binary search is initiated, c[13:0] and c_ready are both set to a logic state 0, at step 100 in FIG. 4. These states are illustrated in the waveform depiction of FIG. 5. At the next rising edge of clk2r, c[13] is set to logic state 1 at step 102. At the falling edge of clk2r, the uda generator 48 will update its value. Step 104 is a logic decision block for the value of uda. At the next rising edge of clk2r, if uda is at a logic state 1, signal c[13] is fixed to logic state 1. If not, c[13] is fixed to logic state 0 as step 106.

At the same time, signal c[12] is set to logic state 1. Step 108 is a logic decision block to determine whether N is equal to zero, indicating that the search has progressed through all c signal settings. If not, N is decremented by 1 at step 110 and the data flow reverts to step 102. The steps are repeated to fix the value for c[12] and the remaining c[11:0] until c[0] is fixed as determined at step 108. At this point c_ready will be turned high by c generator 44 at step 112. From c[13] to c[0], each control pin has a different weight for adjusting the DCO output clock period, c[13] having the largest and c[0] the smallest. Step 114 is a logic decision block to determine whether the PLL is locked for the values of c obtained in the binary search. If the system is not unlocked, the flow returns to step 108. If a determination is made that the system is unlocked, unlock detector 52 issues a reset signal to return the flow to step 100.

In theory, the weight of signal c[12] should be equal to 50% of signal c[13], the weight of signal c[11] should be equal to 50% of signal c[12], and so on, so that the weight of signal c[0] will be equal to $\frac{1}{2}^{13}$ that of c[13], around 0.012%. Extreme accuracy would thereby be provided. However, considering that there may be process variations, temperature variations, and voltage variations, the actual ratio may not exactly equal to 50%. The ratio can be adjusted slightly higher to assure that such variations are not detrimental. The following table shows possible different weights for c[13] to c[0] (unit: ps): c[13]-640, c[12]-321, c[11]-185, c[10]-94.7, c[9]-49.3, c[8]-29.3, c[7]-18.4, c[6]-11.2, c[5]-7.86, c[4]-5.66, c[3]-4.14, c[2]-2.69, c[1]-2.13, c[0]-1.41.

After the value of "c[13:0]" is fixed, a coarse capturing of the expected frequency is established. However, this frequency is still not sufficiently accurate and further tuning has to be done. Although the DCO can be designed such that changing the value of "c[0]" allows an adjustment of as small as 1.4 ps to be applied to the DCO output clock cycle time, a 1.4 ps tuning accuracy provided by the c control signal is still insufficient. This is because jitter is multiplied after passing through the feedback counter Counter(F) and can be accumulated to cause a jitter of 2*DF*1.4 ps at the last dco_out cycle within a clk2r period. A jitter of 2*DF*1.4 ps is quite significant.

To reduce or eliminate DCO output clock jitter, cycle control is effected in the following manner. When the PLL is locked, one period of clk2r $T_{clk2r}$ is equal to 2*DF times of each dco_out period, $T_{dco}$. Assuming that c[0] switched off, that is, its associated DL0 shown in the FIG. 2 DCO is deactivated and does not load the DCO ring oscillator, the first 2*DF−1 dco_out cycles will each have a period of $T_{dco}$−1.4 ps. Since dco_en sets dco_out to '0' at its falling edge and rising edge of clk2r, 2*DF cycles of dco_out will have to be fitted into one clk2r period. Therefore, the period of the last cycle of dco_out will be $$T_{lcd}=T_{clk2r}-(2*DF-1)(T_{dco}-1.4ps)$$

Figure 7A:
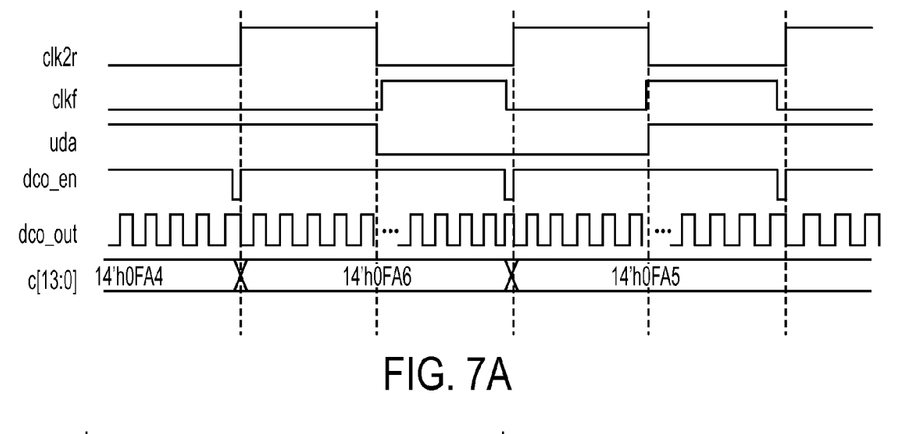
FIGS. 7A and 7B are waveform diagrams representing jitter control when the PLL is in locked operation.

As shown in FIG. 7A, the period of this last dco_out cycle is longer compared to the other 2*DF−1 cycles before it and the difference can correspond to a jitter of 2*DF*1.4 ps $$T_{lcd}-(T_{dco}-1.4\text{ ps}) = T_{clk2r} - (2*DF-1)(T_{dco}-1.4\text{ ps}) -$$
$$(T_{dco}-1.4\text{ ps})$$
$$= 2*DF*T_{dco} - (2*DF-1)(T_{dco}-1.4\text{ ps}) -$$
$$(T_{dco}-1.4\text{ ps})$$

$$= 2*DF*1.4 \text{ ps}$$

Similarly, if c[0] is switched on, an accumulated jitter of 2*DF*1.4 ps will also be present in the last dco_out cycle but the period of this last cycle will be shorter compared to the other 2*DF−1 cycles before it. Since the load cell associated with c[0] is already very small in size, there is little room for accuracy improvement through device shrinkage and as such alternative methods of addressing the jitter method has to be deployed.

A new method, called cycle control, is used to reduce the DCO output clock jitter. In general terms, cycle control involves adjusting the "dco_out" time period of some cycles within a single clk2r time period in response to feedback from the "ud generator" as to whether the dco_out frequency is faster or slower than the target value. Therefore, unlike the c[13:0] control signals produced by the "c_generator" where the settings within a single clk2r cycle are not modified, the load settings applied to the DCO can be varied within a clk2r period by having the "asc" signal take on different values within a single clk2r cycle. This allows for greater precision in tuning the DCO to the required frequency.

The signal responsible for reducing the DCO output "clock jitter is the output signal asc generated by the asc generator module 42 shown in FIG. 4. asc follows the clock of dco_out which has a higher frequency compared to the frequency of clk2r that c[13] to c[0] follow. In this way, multiple changes in the asc value may be made within one clk2r period. When asc is switched on, the period of each DCO output clock cycle will be increased by a fixed amount e.g. 2 ps as the DLA load tied to the asc signal is activated thus slowing down the ring oscillator. On the other hand, when asc is switched off, DLA is deactivated and there is no adjustment made. In one clk2r cycle, there are 2*DF dco_out cycles, if we set asc to '1' in a certain percent of dco_out cycles, and set asc to '0' in other dco_out cycles, then the accumulate jitter in one clk2r cycle will be significantly decreased.

The dco_out cycles within a clk2r period is grouped into subsets comprising 12 dco_out cycles each (other numbers may also be suitable). The value of the plus_num[3:0] input signal. (which is a binary string) determines the number of dco_out cycles within each subset of 12 for which asc is equal to high. The plus_num generator module 40 in FIG. 4 generates the plus_num[3:0] signal at the rising edge of the clk2r signal. If uda is equal to '1' at the clk2r rising edge, plus_num [3:0] will increase by 1, which means that asc will be '1' for an additional dco_out cycle within each subset of 12, otherwise plus_num[3:0] will decrease by 1 within each subset of 12. As discussed above, a uda value of '1' indicates that the dco_out clock is fast while a uda value of 0 indicates that it is slow. Therefore, the asc adjustment is based on the uda generator indication as to whether dco_out is fast or slow.

Figure 7B:
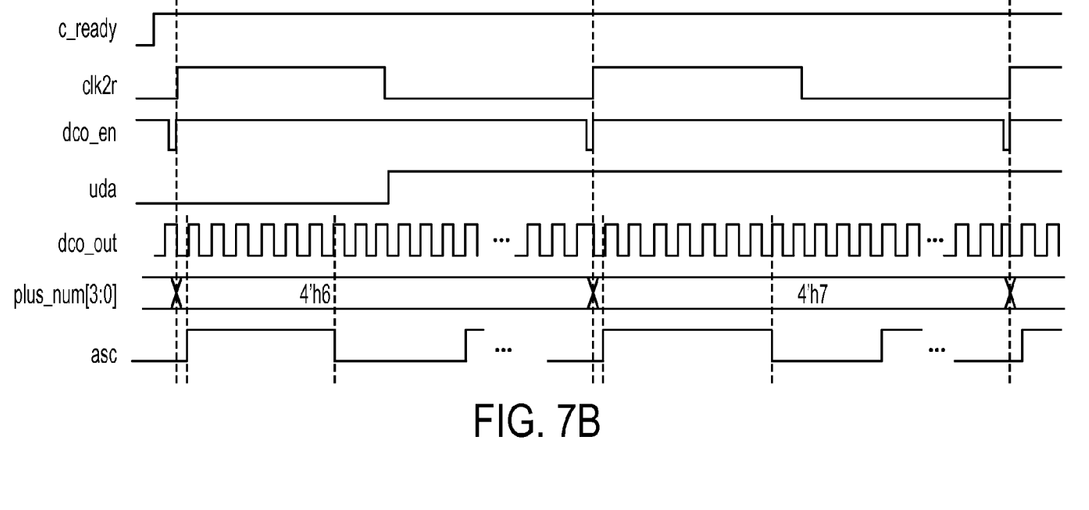

Referring now to the example in FIG. 7B, which shows the application of cycle control, uda is 0 at the rising edge of the first clk2r cycle from the left, therefore, asc is high for 6 dco_out cycles. Meanwhile, uda is 1 at the rising edge of the second clk2r cycle, therefore, asc is high for 7 dco_out cycles.

Assuming that the dco_out cycles within a clk2r period is grouped into subsets comprising 12 dco_out cycles each and any adjustment to a dco_out cycle is 2 ps, the maximum jitter may be reduced to (2*DF/12)*2 ps by using cycle control. This is because the dco_out cycle is adjusted by 2*DF/12 times within a clk2r period when plus_num value changes in value. The maximum jitter of dco_out happens at the last dco_out cycle of each clk2r period.

After the binary search, c[13:0] are fixed, the cycle control procedure is initiated. The module lock detector 50 will then detect whether the uda signal will toggle between logic states (0->1, or 1->0) at every clk2r cycle. If uda toggles to the opposite value for three continuous clk2r cycles, lock detector 52 will generate a logic high lock signal, which indicates that the PLL system is locked. If, thereafter, the reference input clock frequency, the input divider rate DR, or the counter number setting DF is changed, the module unlock detector 52 will detect whether the skew of clk2r and clkf is larger than the threshold delay. If so, a short positive pulse unlockt_rst will be generated to reset the PLL system. The lock signal returns to the low logic state, and the PLL system will restart the binary search procedure to again fix the c[13:0] signals. The system can again attain the locked state in a maximum of twenty five divided reference clock cycles (clk2r).

While the PPL system is in the locked state, the postc generator module 46 is operative to increase the input clock jitter tolerance. The function of the postc generator module is to increase the PLL's tolerance to input clock jitter by generating an binary output signal postc[5:0] which is fed into the DCO and used to make minor adjustments to the DCO frequency so that it can track the input clock frequency, clkin.

In the present described embodiment, postc[5:0] is a 6 digit binary string. As shown in the DCO schematic in FIG. 2, each digit in the postc[5:0] binary string is associated with a respective digital load DL0. A '0' value deactivates the associated load cell while a "1" value activates it. The value of the postc signal is changeable based on the value of the ud_postc [1:0] signal fed into the postc generator from the ud generator. The value of the ud_postc[1:0] signal in turn varies based on the combination of plus_num[3:0] and uda. When plus_num [3:0] equals to 4'b1011, and uda is '0', then ud_postc[1:0] will be 2'b01. If "plus_num[3:0]" equals to 4'b0000, and "uda" is '1', then "ud_postc[1:0]" will be 2'b10, otherwise, "ud_postc[1:0]" will be 2'b00. Therefore, it is possible to vary the loading on the DCO ring oscillator and hence adjust the DCO_out frequency in response to input clock jitter or minor frequency change.

Figure 8:
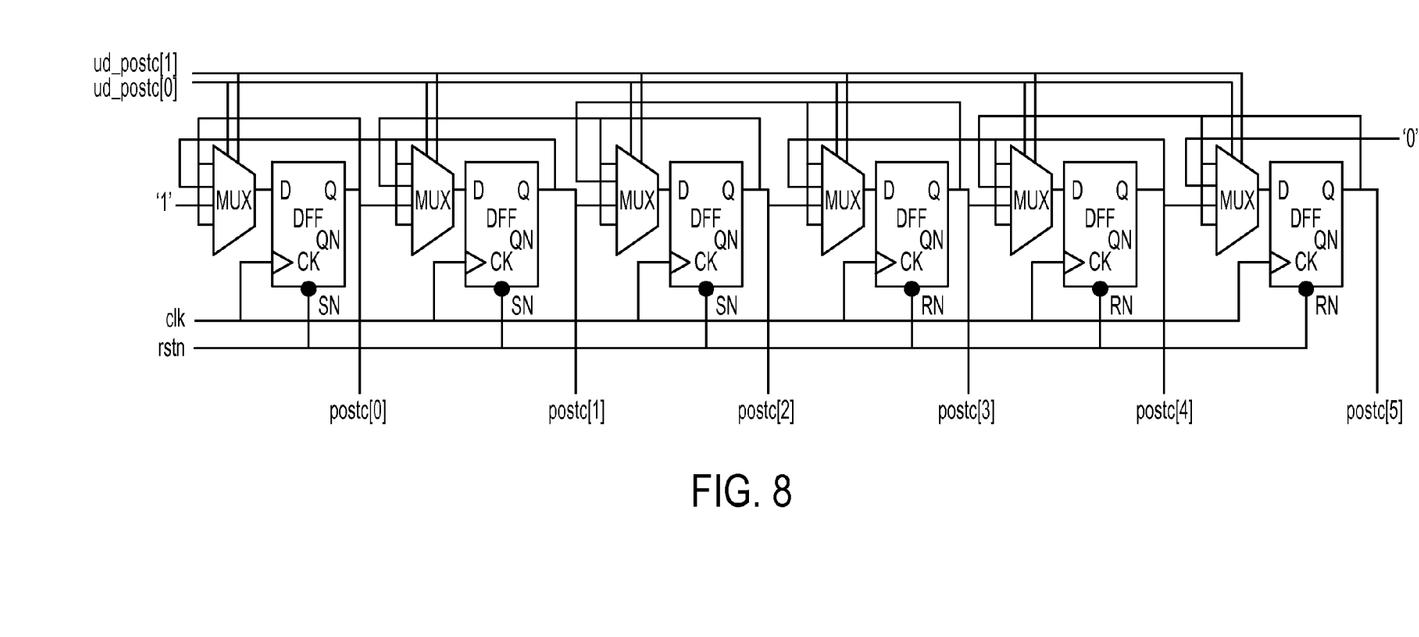
FIG. 8 is a schematic diagram of a shift generator represented as "postc generator" in FIG. 4.

FIG. 8 is a schematic diagram of a postc generator in accordance with one embodiment of the disclosure. The postc generator is a bi-directional shift chain where ud_postc[1:0] is used to control whether the shift chain shifts to the right or left. For example, when Ud_postc[1:0]=2'b01, the postc[0] to postc[5] chain is shifted to the right and the leftmost output in FIG. 8 postc[0] is set to 1. Therefore, if postc[0:5] initially has a reset value of 111000, Ud_postc[1:0]=2'b01 will result in a new postc[0:5] of 111100. On the other hand, when Ud_postc=2'b10, the postc[0] to postc[5] chain is shifted to the left and the rightmost output in FIG. 8 postc[5] is set to 0. Therefore, a postc[0:5] with an original value of 111000, will be changed to 110000. When Ud_postc=2'b00 or 2'b11, there is no change in postc[0:5].

Figure 9:
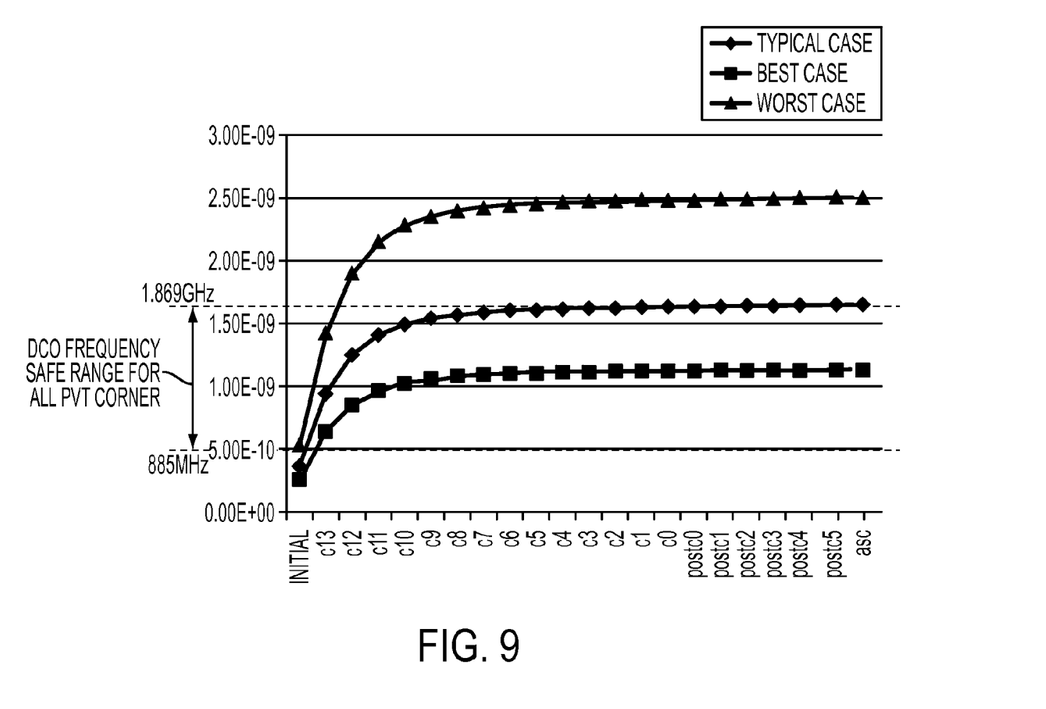
FIG. 9 is a graphical representation showing the DCO output clock frequency range in various operating conditions.

FIG. 9 is a graphical representation showing the DCO output clock frequency range at typical case, best case and worst case DCO frequency tuning range for all PVT corners: 0.885 GHz~1.869 GHz. Best case PVT corner:—40 C/1.1V/ FF. Typical case PVT corner: 25 C/1.0V/TT. Worst case PVT corner: 125 C/0.9V/SS.

In summary, the disclosed digital PLL system is achieves good performance while occupying very small chip area. Delay cell number adjust, delay cell load adjust and cycle control are performed to digitally control the DCO frequency to cover a wider frequency range with smaller jitter than existing PLL arrangements. The binary search is used to achieve fastest lock. After the PLL is locked, a shift scan chain is used to trace the reference frequency change so as to get better input clock jitter tolerance. This PLL system uses NAND gates as the basic delay cells, which can totally disable and reset DCO in a very short time, thereby avoiding jitter accumulation to the next reference clock cycle. Stable DCO oscillation is provided. For example, in one example of the disclosed embodiment, the PLL can be been silicon validated using Global Foundries 65 nmG process, the PPL uses only 5255 um² (or 3% the a PLL chip area). DCO frequency could range in 900 MHz~1.8 GHz in all PVT corners. When DCO frequency at 1.8 GHz, the working current is around 1.0 mA using only one 1.0V power supply. This PLL could can be locked very fast in 50 divided reference clock cycle (5 us @10 MHz divided reference clock), and its output clock jitter is smaller than 40 ps.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein. For example, it is within contemplation that equivalent logic elements can be substituted for those described.

What is claimed is:

1. A phase locked loop control system comprising:
    a reference clock input for receiving a reference clock signal;
    a digital controlled oscillator configured to output an adjustable clock signal;
    a digital detector coupled between the reference clock input and an input of the controlled oscillator, the detector coupled to an output of the oscillator and configured for applying control signals to the oscillator for setting output operating signal frequency in accordance with detected frequency of the oscillator output clock signal; and
    a counter coupled to the oscillator output; wherein:
    the digital detector comprises a control signal generator configured to generate a plurality of binary control signals respectively output at a plurality of control signal generator output terminals, a comparator having a first comparator input coupled to the reference clock input, a second comparator input coupled to the counter, and a comparator output coupled to the control signal generator; and
    the oscillator comprises a plurality of decoder logic cells having inputs respectively coupled to the control signal generator output terminals;
    wherein the phase of the output signal is selectively adjusted by the digital detector control signals during each input clock cycle.

2. A phase locked loop control system as recited in claim 1, wherein the control signal generator is responsive to the divided reference clock signal.

3. A phase locked loop control system comprising:
    a reference clock input for receiving a reference clock signal;
    a digital controlled oscillator configured to output an adjustable clock signal;
    an input divider coupled to the reference clock input for dividing the reference clock signal to one of a plurality of preset dividing rates; and
    an output divider coupled to the oscillator output for dividing the oscillator output signal to one of a plurality of preset dividing rates; and
    a digital detector coupled between the reference clock input and an input of the controlled oscillator, the detector coupled to an output of the oscillator and configured for applying control signals to the oscillator for setting output operating signal frequency in accordance with detected frequency of the oscillator output clock signal;
    wherein the phase of the output signal is selectively adjusted by the digital detector control signals during each input clock cycle;
    the digital detector comprises a control signal generator configured to generate a plurality of binary control signals respectively output at a plurality of control signal generator output terminals; and
    the oscillator comprises a plurality of decoder logic cells having inputs respectively coupled to the control signal generator output terminals;
    and further comprising a counter coupled to the oscillator output;
    wherein the digital detector comprises a comparator having a first comparator input coupled to the input divider, a second comparator input coupled to the counter, and a comparator output coupled to the control signal generator.

4. A phase locked loop control system as recited in claim 3, wherein the input divider comprises a control input for selecting a dividing rate for the received reference clock signal and the output divider comprises a control input for selecting a dividing rate for the output signal.

5. A phase locked loop control system as recited in claim 3, wherein the digital detector further comprises a shift generator having a first input coupled to the input divider and a second input coupled to the comparator and an output coupled to the oscillator.

6. A phase locked loop control system as recited in claim 5, wherein the shift generator comprises a plurality of flip-flops connected in series, each flip-flop having an output coupled to a respective control input of the oscillator.

7. A phase locked loop control system comprising:
    a reference clock input for receiving a reference clock signal;
    a digital controlled oscillator configured to output an adjustable clock signal;
    an input divider coupled to the reference clock input for dividing the reference clock signal to one of a plurality of preset dividing rates; and
    an output divider coupled to the oscillator output for dividing the oscillator output signal to one of a plurality of preset dividing rates; and
    a digital detector coupled between the reference clock input and an input of the controlled oscillator, the detector coupled to an output of the oscillator and configured for applying control signals to the oscillator for setting output operating signal frequency in accordance with detected frequency of the oscillator output clock signal;
    wherein the phase of the output signal is selectively adjusted by the digital detector control signals during each input clock cycle;
    the digital detector comprises a control signal generator configured to generate a plurality of binary control signals respectively output at a plurality of control signal generator output terminals; and
    the oscillator comprises a plurality of decoder logic cells having inputs respectively coupled to the control signal generator output terminals;
    and wherein the plurality of decoder logic cells comprises a first group of large delay cells and a second decoder group of small delay cells.

8. A phase locked loop control system as recited in claim 7, wherein the DCO comprise NAND gates as its basic delay cell.

9. A phase locked loop control system as recited in claim 7, wherein the oscillator further comprises a plurality of logic load elements having inputs respectively connected to output terminals of the control signal generator;
 wherein the logic elements are coupled to the detector for receiving the control signals for adjusting the phase of the output signal.

10. A phase locked loop control system comprising:
 a reference clock input for receiving a reference clock signal;
 a digital controlled oscillator configured to output an adjustable clock signal;
 an input divider coupled to the reference clock input for dividing the reference clock signal to one of a plurality of preset dividing rates; and
 an output divider coupled to the oscillator output for dividing the oscillator output signal to one of a plurality of preset dividing rates; and
 a digital detector coupled between the reference clock input and an input of the controlled oscillator, the detector coupled to an output of the oscillator and configured for applying control signals to the oscillator for setting output operating signal frequency in accordance with detected frequency of the oscillator output clock signal;
 wherein the phase of the output signal is selectively adjusted by the digital detector control signals during each input clock cycle;
 the digital detector comprises a control signal generator configured to generate a plurality of binary control signals respectively output at a plurality of control signal generator output terminals; and
 the oscillator comprises a plurality of decoder logic cells having inputs respectively coupled to the control signal generator output terminals;
 and wherein the wherein the digital detector further comprises an asynchronous cycle control generator having an input coupled to the oscillator output signal; and
 wherein the control signal generator binary output control signals are fixed to capture the frequency of the reference clock signal and the asynchronous cycle control generator is responsive to the phase of the oscillator output signal relative to the divided reference signal.

11. A phase locked loop control system as recited in claim 10, wherein the digital detector further comprises a lock detector responsive to the dividing rates of the input divider and output divider to generate a lock output signal.

12. A phase locked loop control system as recited in claim 11, wherein the digital detector further comprises an unlock generator for outputting a reset signal in response to the lock output signal if a change in the dividing rates of either the input divider or output divider has been detected by the lock detector.

* * * * *